(12) United States Patent
Fainzilber et al.

(10) Patent No.: US 9,407,290 B2
(45) Date of Patent: Aug. 2, 2016

(54) ERROR-CORRECTION DECODING WITH CONDITIONAL LIMITING OF CHECK-NODE MESSAGES

(71) Applicant: SanDisk Technologies, Inc., Plano, TX (US)

(72) Inventors: Omer Fainzilber, Even Yehuda (IL); Eran Sharon, Rishon Lezion (IL); Idan Alrod, Herzliya (IL)

(73) Assignee: SanDisk Technologies LLC, Plano, TX (US)

(*) Notice: Subject to any disclaimer, the term of this patent is extended or adjusted under 35 U.S.C. 154(b) by 406 days.

(21) Appl. No.: 13/840,428

(22) Filed: Mar. 15, 2013

(65) Prior Publication Data

US 2014/0281785 A1    Sep. 18, 2014

(51) Int. Cl.
*H03M 13/00* (2006.01)
*H03M 13/05* (2006.01)
*G06F 11/10* (2006.01)
*H03M 13/11* (2006.01)
*H03M 13/37* (2006.01)

(52) U.S. Cl.
CPC ...... *H03M 13/1108* (2013.01); *H03M 13/1111* (2013.01); *H03M 13/1142* (2013.01); *H03M 13/3723* (2013.01); *H03M 13/6583* (2013.01)

(58) Field of Classification Search
None
See application file for complete search history.

(56) References Cited

U.S. PATENT DOCUMENTS

| | | | |
|---|---|---|---|
| 7,716,561 B2 | 5/2010 | Belogolovyi et al. | |
| 7,818,563 B1 | 10/2010 | Dwork et al. | |
| 8,504,895 B2 | 8/2013 | Sharon et al. | |
| 2006/0156171 A1 | 7/2006 | Kuznetsov et al. | |
| 2008/0010581 A1 | 1/2008 | Alrod et al. | |
| 2008/0244360 A1 | 10/2008 | Mokhlesi et al. | |
| 2008/0294960 A1 | 11/2008 | Sharon et al. | |
| 2009/0199074 A1 | 8/2009 | Sommer | |
| 2009/0217124 A1 | 8/2009 | Litsyn et al. | |
| 2009/0319858 A1 | 12/2009 | Sharon et al. | |
| 2009/0319860 A1 | 12/2009 | Sharon et al. | |
| 2009/0319861 A1 | 12/2009 | Sharon et al. | |
| 2010/0042891 A1 | 2/2010 | Gunnam et al. | |
| 2010/0042896 A1 | 2/2010 | Gunnam | |

(Continued)

OTHER PUBLICATIONS

Chang, C. Y., et al.; "*Check Reliability Based Bit-Flipping Decoding Algorithms for LDPC Codes*;" Institute of Communications Engineering; dated Jan. 14, 2010; retrieved on Mar. 29, 2013 from <http://arxiv4.library.cornell.edu/PS_cache/arxiv/pdf/1001/1001.2503v1.pdf>.

(Continued)

*Primary Examiner* — Justin R Knapp
(74) *Attorney, Agent, or Firm* — Alston & Bird LLP

(57) ABSTRACT

An example method is provided that includes receiving a representation of a codeword that includes a plurality of bits, and associating the bits with a respective plurality of one-bit hard-bit values representing the bits and multiple-bit soft-bit values representing measures of reliability of respective hard-bit values. The method may include determining whether participating bits for a particular parity-check equation from the plurality of parity check equations satisfy the particular parity-check equation. The method may further include determining, based on whether the particular parity-check equation is satisfied, a magnitude of a reliability modification to one or more reliability values associated with at least one of the participating bits. The method may also include modifying the one or more reliability values by the magnitude of the reliability modification.

24 Claims, 8 Drawing Sheets

(56) References Cited

U.S. PATENT DOCUMENTS

| | | | |
|---|---|---|---|
| 2010/0088575 A1* | 4/2010 | Sharon | G06F 11/1072 714/763 |
| 2010/0169737 A1 | 7/2010 | Litsyn et al. | |
| 2010/0192043 A1 | 7/2010 | Alrod et al. | |
| 2010/0199149 A1 | 8/2010 | Weingarten et al. | |
| 2014/0108883 A1* | 4/2014 | Tehrani et al. | 714/758 |
| 2014/0143637 A1* | 5/2014 | Cohen et al. | 714/773 |
| 2014/0164865 A1* | 6/2014 | Sharon et al. | 714/752 |
| 2014/0281800 A1* | 9/2014 | Micheloni et al. | 714/759 |
| 2014/0281823 A1* | 9/2014 | Micheloni et al. | 714/773 |

OTHER PUBLICATIONS

Chen, J., et al.; "*Density evolution for two improved BP-Based decoding algorithms of LDPC codes;*" IEEE Communications Letter, vol. 6, No. 5; pp. 208-210; dated May 2010.

Chen, J., et al.; "*Near optimum universal belief propagation based decoding of low-density parity-check codes;*" IEEE Transactions on Communications, vol. 50, No. 3; pp. 406-414; dated Mar. 2002.

Chen, J., et al.; "*Reduced-complexity decoding of LDPC codes;*" IEEE Transactions on Communications, vol. 53, No. 8; pp. 1288-1299; dated Aug. 2005; retrieved on Mar. 29, 2013 from <http://www.ee.ust.hk/~eejinjie/research_files/LDPC_files/low%20complexity/Reduced-Complexity%20of%20LDPC%20Codes.pdf>.

Fossorier, M. P. C., et al., "*Reduced complexity iterative decoding of low-density parity check codes based on belief propagation;*" IEEE Transactions on Communications, vol. 47, No. 5; pp. 673-680; dated May 1999; retrieved on Mar. 29, 2013 from <www.engr.sjsu.edu/rmorelos/ee296f05/Fossorier1999.pdf>.

Guo, F., et al.; "*Reliability ratio based weighted bit-flipping decoding for LDPC codes;*" VTC Spring 2005; IEEE, vol. 1; pp. 709-713; dated May 2005; retrieved on Mar. 29, 2013 from <eprints.soton.ac.uk/261664/1/spring.pdf>.

Jiang, M., et al.; "*An improvement on the modified weighted bit flipping decoding algorithm for LDPC codes;*" IEEE Communications Letter, vol. 9, No. 9; pp. 814-816; dated Sep. 2005; retrieved on Mar. 29, 2013 from <http://www.google.com/url?sa=t&rct=j&q=an%20improvement%20on%20the%20modified%20weighted%20bit%20flipping%20decoding%20algorithm%20for%20ldpc%20codes&source=web&cd=2&ved=0CDsQFjAB&url=http%3A%2F%2F117.55.241.6%2Fieee%2F2005%2FCommunication%2520Letters%2C%2520IEEE%2FVol.9.Issue.9%2FAn%2520improvement%2520on%2520the%2520modified%2520weighted%2520bit%2520flipping%2520decoding%2520algorithm%2520for%2520LDPC%2520codes.pdf&ei=d6pVUZmqDoWg8gTq0oCYDw&usg=AFQjCNHLoFm-3Y_L3xl3kFfL-t7SCACFeg&bvm=bv.44442042,d.eWU>.

Kou, Y., et al.; "*Low-density parity-check codes based on finite geometries: a rediscovery and new results;*" IEEE Transactions on Inf. Theory, vol. 47, No. 7; pp. 2711-2736; dated Nov. 2001; retrieved on Mar. 29, 2013 from <http://www.csie.ntu.edu.tw/~b90091/paper/LDPC%20ReDiscovery%20and%20new%20Result.pdf>.

Leiner, B. M. J.; "*LDPC Codes—a brief Tutorial;*" pp. 1-9; dated Apr. 8, 2005.

"*Low-density parity-check code;*" Wikipedia; retrieved on Mar. 29, 2013 from <http://en.wikipedia.org/w/index.php?oldid=428961552>.

Shokrollahi, A.; "*LDPC Codes: An Introduction;*" pp. 1-33; dated Dec. 7, 2002.

Zhang, J., et al.; "*A modified weighted bit flipping decoding of low-density parity-check codes;*" IEEE Communications Letter, vol. 8, No. 3; pp. 165-167; dated Mar. 2004.

International Preliminary Report on Patentability for Application No. PCT/IL2011/000617; dated Feb. 4, 2014.

International Search Report and Written Opinion for Application No. PCT/IL2011/000617; dated Dec. 19, 2011.

Search Report for Taiwan Application No. 101127690 dated Nov. 27, 2014.

\* cited by examiner

ERROR-CORRECTION DECODING WITH CONDITIONAL LIMITING OF CHECK-NODE MESSAGES

TECHNICAL FIELD

The present invention generally relates to error-correction decoding and, more particularly, relates to error-correction decoding with conditional limiting of check-node messages.

BACKGROUND

Error Correction Codes (ECCs) are commonly used in communication and storage systems. Various physical phenomena occurring both in communication channels and in storage devices result in noise effects that corrupt the communicated or stored information. Error correction coding schemes can be used for protecting the communicated or stored information against the resulting errors. This is done by encoding the information before transmission through the communication channel or storage in the memory device. The encoding process transforms an information bit sequence into a codeword by adding redundancy to the information. For example, the encoding process may add one or more parity bits to the bit sequence. This redundancy can then be used in order to recover the information from a corrupted codeword through a decoding process. An ECC decoder decodes the corrupted codeword and recovers a bit sequence that should be equal to the original information bit sequence with high probability.

Iterative coding schemes have become very popular in recent years, due to the ability of such codes to achieve near Shannon limit performance at low decoding complexity.

One popular class of iterative codes is Low-Density Parity-Check (LDPC) codes. An LDPC code is a linear binary block code defined by a sparse parity-check matrix H. As shown in FIG. 1, the code can also be defined by a sparse bipartite graph G=(V, C, E) with a set V of N bit nodes (N=13 in FIG. 1), a set C of M check nodes (M=10 in FIG. 1) and a set E (E=38 in FIG. 1) of edges connecting bit nodes to check nodes. The bit nodes correspond to the codeword bits and the check nodes correspond to parity-check constraints on the bits. A bit node is connected by edges to the check nodes in which it participates.

LDPC codes can be decoded using iterative message passing decoding algorithms. These algorithms operate by exchanging messages between bit nodes and check nodes over the edges of the underlying bipartite graph representing the code. The decoder is provided with initial estimates of the codeword bits (based on the communication channel output or based on the read memory content). These initial estimates are refined and improved by imposing the parity-check constraints that the bits should satisfy as a valid codeword. This is done by exchanging information between the bit nodes representing the codeword bits and the check nodes representing parity-check constraints on the codeword bits, using the messages that are passed along the graph edges. Example embodiments of implementation of a LDPC code are described further in U.S. patent application Ser. No. 12/489,576, filed Jun. 23, 2009, and U.S. Provisional Patent Application 61/074,706, which are herein incorporated by reference in their entirety.

The bit estimations conveyed by the messages passed along the graph edges can be expressed in various forms. A common measure for expressing bit estimation is Log-Likelihood Ratio (LLRs), which is defined in the following equation:

$$LLR = \log \frac{Pr(v = 0 \mid \text{current constraints and observations})}{Pr(v = 1 \mid \text{current constraints and observations})} \quad (1)$$

where the "current constraints and observations" are the various parity-check constraints taken into account in computing the message at hand, and the observations v correspond to the bits participating in these parity checks. Without loss of generality, LLR notation is used throughout the rest of this document. The sign of the LLR provides the bit estimation (i.e., positive LLR corresponds to v=0, and negative LLR corresponds to v=1). The magnitude of the LLR provides the reliability of the estimation (i.e., |LLR|=0 means that the estimation is completely unreliable; and |LLR|=∞ means that the estimation is completely reliable, and the bit value is known).

The messages passed during the decoding operation along the graph edges between bit nodes and check nodes may be extrinsic. An extrinsic message m passed from a node n on edge e may take into account all the values received on edges connected to n other than edge e. In other words, extrinsic messages may be based only on new information.

One example of a message passing decoding algorithm is the belief-propagation (BP) algorithm, which is one of the more common algorithms among this family of algorithms.

Let $P_v$ denote the initial decoder estimation for bit v, based solely on the received or read symbol y, where $P_v$ is a LLR value that may be defined as follows:

$$P_v = \log \frac{Pr(v = 0 \mid y)}{Pr(v = 1 \mid y)} \quad (2)$$

Let $Q_v$ denote the final decoder estimation for bit v, based on the entire received or read sequence $\underline{y}$, and assuming that bit v is part of a codeword (i.e., assuming H·$\underline{v}$=0 where $\underline{v}$ (underlined) denotes a vector and v denote a single element of the vector $\underline{v}$), then:

$$Q_v = \log \frac{Pr(v = 0 \mid \underline{y}, H \cdot \underline{v} = 0)}{Pr(v = 1 \mid \underline{y}, H \cdot \underline{v} = 0)} \quad (3)$$

Let $Q_{vc}$ and $R_{cv}$ denote a message from bit node v to check node c, and a message from check node c to bit node v, respectively, then a BP-algorithm utilizes the following update rules for computing the messages.

The bit node to check node computation rule is:

$$Q_{vc} = P_v + \sum_{c' \in N(v,G) \backslash c} R_{c'v} \quad (4)$$

Here N(v, G) denotes the set of neighbors of a node v in graph G and c'∈N(v, G), \c refers to the neighbors excluding node c, and $R_{cv}$ is defined below.

The check node to bit node computation rule is:

$$R_{cv} = \varphi^{-1}\left( \sum_{v' \in N(c,G) \backslash v} \varphi(Q_{v'c}) \right) \quad (5)$$

Here, $$\varphi(x) = \left\{ \text{sign}(x), -\log\tanh\left(\frac{|x|}{2}\right) \right\}$$

and operations in the φ-domain are performed over the group $\{0,1\} \times R^+$ (this basically means that the summation here is defined as summation over the magnitudes and XOR over the signs). In a similar manner to equation (4), N(c, G) denotes the set of bit node neighbors of a check node c in graph G, and v'∈N(c, G)\v refers to said neighbors excluding node v.

The final decoder estimation for bit 'v' is:

$$Q_v = P_v + \sum_{c' \in N(v,G)} R_{c'v} \quad (6)$$

While properly designed LDPC codes are very powerful (e.g., can correct many errors in a single codeword), a phenomenon known as "trapping sets" may cause the decoder to fail. Failure of the decoder may increase the so-called "error floor" of the decoding algorithm. The term "error floor" refers to the effect whereby, below a certain noise level in the communication channel or in the memory device, the error rate of the output of the decoder starts to decrease much more slowly even though the noise that is responsible for the bit errors becomes smaller.

These trapping sets may cause the decoder to fail, even where the number of incorrect bits may be very small and confined to certain regions of the graph. Trapping sets may be generally thought of as sets with a relatively small number of variable nodes such that the induced sub-graph has only a small number of odd degree check nodes. Trapping sets are a problem in the field of storage since such systems typically require a high degree of reliability, and thus a very small error rate (e.g., fewer than one error for every $10^{14}$ bits).

The influence of trapping sets on the onset of error-floors in LDPC codes may be attributed to certain phenomena related to the properties of the code graph and the decoding algorithm used, as well as to realization of certain special channel noise configurations. In the initial stage of BP decoding, variable nodes internal to one particular trapping set (e.g., the so-called "initial trapping set"), experience a large increase in reliability estimates for incorrect bit values due to the presence of special low-probability noise samples. This information may be propagated to other variable nodes in the trapping set, some of which may already have unreliable bit estimates, themselves.

After this initial biasing, external variables may start to correct the initially incorrect estimates. However, the variable nodes in the trapping set may have been biased significantly in their decisions towards the incorrect values due to the influence of the initial trapping set. Since trapping sets may be associated with few check nodes capable of detecting errors within the trapping sets, this erroneous information may persist in the graph until the end of the decoding process.

Furthermore, the unreliable estimates from trapping sets may be amplified or exported to variable nodes external to the trapping set. The degree of influence of the trapping set on the external variables (and vice-versa) may cause further complications in decoding data bits located outside of the trapping set.

One way that others have approached the problem of trapping sets involves reduction of the absolute values of messages in the system, assuming that a larger sum of correct messages will, over time, reverse the error caused by a smaller number of incorrect messages. This may have the effect of preventing the trapping set from "locking" in an incorrect value with high reliability. While this method may reduce the number of decoding errors, it may not always solve the problem. Furthermore, it may degrade decoder performance since additional time may be required for the reduced value messages to converge.

BRIEF SUMMARY

In light of the foregoing background, example embodiments of the present invention provide an improved apparatus and method for error-correction decoding. In particular, example embodiments provide for improved iterative decoding using message passing. In particular, some example embodiments are applicable to message passing algorithms along a Tanner graph used in the decoding of LDPC codes.

Embodiments may include a method for error correction decoding. The method may include receiving a representation of a codeword that includes a plurality of bits. Each of the plurality of bits may be associated with at least one bit-value and at least one reliability value. The codeword may be subject to a plurality of parity-check equations, each of which includes participating bit-values corresponding to a respective plurality of the bits of the codeword. Each bit of the codeword may participate in one or more parity-check equations. The method may also include determining whether the bit-values of the participating bits for a particular parity-check equation from the plurality of parity check equations satisfy the particular parity-check equation, determining for at least one participating bit, based on whether the particular parity-check equation is satisfied, at least one magnitude of a reliability modification to the reliability value. The reliability value may be associated with at least one of the participating bits. The method may also include modifying the reliability value of the at least one participating bit as a function of the magnitude of the reliability modification. Embodiments of the method may further include modifying one or more of the bit-values based on the modified reliability values, and decoding the codeword using the one or more bit-values and the one or more reliability values. In some embodiments, the magnitude of the reliability modification for at least one bit is greater where the particular parity-check equation is not satisfied than where the particular parity-check equation is satisfied.

In some embodiments, the method may include determining that the magnitude of the reliability modification exceeds a reliability adjustment threshold. The reliability adjustment threshold may be determined based on whether the particular parity-check equation is satisfied. The method may also include, in response to determining that the magnitude of the reliability modification exceeds the reliability adjustment threshold, reducing the magnitude to the reliability adjustment threshold. In some embodiments, the method may include modifying the at least one reliability value over a plurality of iterations, and determining the reliability adjustment threshold based on an iteration count of the plurality of iterations. Each iteration may include determining whether a given set of participating bits satisfies a given parity-check equation associated with the given set of participating bits. The step of determining at least one magnitude of a reliability modification further may include computing an initial magnitude of the reliability adjustment, and in response to determining that the particular parity-check equation is satisfied, multiplying the initial magnitude by a positive number less than 1 to determine the magnitude of the reliability adjustment. The method may also include determining a reliability value for at least one of the plurality of bits using on extrinsic information. Some embodiments of the method may include, in response to determining that the particular parity-check equation is satisfied, using the reliability values associated with the particular set of the plurality of bits to determine a probability that the particular parity-check equation is correctly satisfied. The magnitude of the reliability modification may be modified based on the probability that the particular parity-check equation is correctly satisfied. Embodiments of method may further include comparing the probability that the particular parity-check equation is correctly satisfied with a correctness threshold, and modifying the magnitude of the reliability modification based on whether the probability exceeds the correctness threshold. The method may also include increasing the magnitude of the reliability modification in response to the probability exceeding the correctness threshold. In yet further embodiments, the method may include modifying the at least one reliability value over a plurality of iterations, each iteration comprising determining whether a given set of bits of the plurality of bits satisfies a given parity-check equation, and determining the correctness threshold based on an iteration count of the plurality of iterations. The step of determining whether the bit-values of the participating bits for a particular parity-check equation satisfy the particular parity-check equation may include determining whether the parity-check equation is satisfied based on an XOR operation performed on the participating bit-values. Embodiments may also include a computer program product comprising instructions that, when executed by a processor, cause the processor to perform the method.

Embodiments may also provide additional methods for error correction decoding. Some of these embodiments may include receiving a representation of a codeword that includes a plurality of bits, wherein the codeword is subject to a plurality of parity-check equations. Each of the parity check equations may include participating bits corresponding to a respective plurality of the bits of the codeword. Each bit of the codewords participating in one or more parity-check equations and each bit may be associated with at least one reliability value. The method may also include determining whether the participating bits for a particular parity-check equation from the plurality of parity check equations satisfy the particular parity-check equation, determining whether at least one of the participating bits should be inverted based on the result of the parity-check equation, determining, based on whether the at least one of the participating bits should be inverted, a magnitude of a reliability modification to one or more reliability values associated with at least one of the participating bits, and modifying the one or more reliability values by the magnitude of the reliability modification. Embodiments may include a computer program product comprising instructions that, when executed by a processor, cause the processor to perform the method.

Some embodiments may also provide an apparatus. The apparatus may be configured to at least perform certain actions. The actions may include receiving a representation of a codeword that includes a plurality of bits. Each of the plurality of bits may be associated with at least one bit-value and at least one reliability value. The codeword may be subject to a plurality of parity-check equations each of which includes participating bit-values corresponding to a respective plurality of the bits of the codeword. Each bit of the codeword may participate in one or more parity-check equations. The apparatus may be further configured to determine whether the bit-values of the participating bits for a particular parity-check equation from the plurality of parity check equations satisfy the particular parity-check equation, to determine, for at least one participating bit, based on whether the particular parity-check equation is satisfied, at least one magnitude of a reliability modification to the reliability value associated with at least one of the participating bits, and to modify the reliability value of the at least one participating bit as a function of the magnitude of the reliability modification. The apparatus may be further configured to modify one or more of the bit-values based on the modified reliability values, and to decode the codeword using the one or more bit-values and the one or more reliability values. The magnitude of the reliability modification for at least one bit may be greater where the particular parity-check equation is not satisfied than where the particular parity-check equation is satisfied. The apparatus may be further configured to determine that the magnitude of the reliability modification exceeds a reliability adjustment threshold, wherein the reliability adjustment threshold is determined based on whether the particular parity-check equation is satisfied, and to, in response to determining that the magnitude of the reliability modification exceeds the reliability adjustment threshold, reduce the magnitude to the reliability adjustment threshold.

Embodiments of the apparatus may be further configured to modify the at least one reliability value over a plurality of iterations. Each iteration may include determining whether a given set of participating bits satisfies a given parity-check equation associated with the given set of participating bits, and determining the reliability adjustment threshold based on an iteration count of the plurality of iterations. The step of determining at least one magnitude of a reliability modification may include computing an initial magnitude of the reliability adjustment, and in response to determining that the particular parity-check equation is satisfied, multiplying the initial magnitude by a positive number less than 1 to determine the magnitude of the reliability adjustment. Embodiments of the apparatus may be further configured to determine a reliability value for at least one of the plurality of bits using on extrinsic information. Some embodiments may be further configured to, in response to determining that the particular parity-check equation is satisfied, use the reliability values associated with the particular set of the plurality of bits to determine a probability that the particular parity-check equation is correctly satisfied, wherein the magnitude of the reliability modification is modified based on the probability that the particular parity-check equation is correctly satisfied. Embodiments of the apparatus may also be configured to compare the probability that the particular parity-check equation is correctly satisfied with a correctness threshold, and to modify the magnitude of the reliability modification based on whether the probability exceeds the correctness threshold. Embodiments may be configured to increase the magnitude of the reliability modification in response to the probability exceeding the correctness threshold.

Some embodiments of the apparatus may be configured to modify the at least one reliability value over a plurality of iterations. Each iteration may include determining whether a given set of bits of the plurality of bits satisfies a given parity-check equation, and determining the correctness threshold based on an iteration count of the plurality of iterations. The act of determining whether the bit-values of the participating bits for a particular parity-check equation satisfy the particular parity-check equation may include determining whether the parity-check equation is satisfied based on an XOR operation performed on the participating bit-values.

Yet further embodiments may provide a memory controller configured to cause decoding at least one codeword. The decoding may be performed by at least a method including receiving a representation of the codeword that includes a plurality of bits. Each of the plurality of bits may be associated with at least one bit-value and at least one reliability value. The codeword may be subject to a plurality of parity-check equations each of which includes participating bit-values corresponding to a respective plurality of the bits of the codeword. Each bit of the codeword may participate in one or more parity-check equations. The memory controller may be further configured to perform the decoding by determining whether the bit-values of the participating bits for a particular parity-check equation from the plurality of parity check equations satisfy the particular parity-check equation, determining for at least one participating bit, based on whether the particular parity-check equation is satisfied, at least one magnitude of a reliability modification to the reliability value associated with at least one of the participating bits, and modifying the reliability value of the at least one participating bit as a function of the magnitude of the reliability modification. Embodiments may further include modifying one or more of the bit-values based on the modified reliability values, and decoding the codeword using the one or more bit-values and the one or more reliability values. The magnitude of the reliability modification for at least one bit may be greater where the particular parity-check equation is not satisfied than where the particular parity-check equation is satisfied. The decoding may include determining that the magnitude of the reliability modification exceeds a reliability adjustment threshold, wherein the reliability adjustment threshold is determined based on whether the particular parity-check equation is satisfied, and, in response to determining that the magnitude of the reliability modification exceeds the reliability adjustment threshold, reducing the magnitude to the reliability adjustment threshold. In some embodiments, the decoding may include modifying the at least one reliability value over a plurality of iterations. Each iteration may include determining whether a given set of participating bits satisfies a given parity-check equation associated with the given set of participating bits, and determining the reliability adjustment threshold based on an iteration count of the plurality of iterations. The act of determining at least one magnitude of a reliability modification may include computing an initial magnitude of the reliability adjustment, and, in response to determining that the particular parity-check equation is satisfied, multiplying the initial magnitude by a positive number less than 1 to determine the magnitude of the reliability adjustment. The decoding may include determining a reliability value for at least one of the plurality of bits using on extrinsic information. In some embodiments, the decoding further includes, in response to determining that the particular parity-check equation is satisfied, using the reliability values associated with the particular set of the plurality of bits to determine a probability that the particular parity-check equation is correctly satisfied. The magnitude of the reliability modification may be modified based on the probability that the particular parity-check equation is correctly satisfied. In some embodiments, the decoding further includes comparing the probability that the particular parity-check equation is correctly satisfied with a correctness threshold, and modifying the magnitude of the reliability modification based on whether the probability exceeds the correctness threshold. The decoding may further include increasing the magnitude of the reliability modification in response to the probability exceeding the correctness threshold. In yet further embodiments, the decoding further includes modifying the at least one reliability value over a plurality of iterations. Each iteration may include determining whether a given set of bits of the plurality of bits satisfies a given parity-check equation. The decoding may also include determining the correctness threshold based on an iteration count of the plurality of iterations. The step of determining whether the bit-values of the participating bits for a particular parity-check equation satisfy the particular parity-check equation may include determining whether the parity-check equation is satisfied based on an XOR operation performed on the participating bit-values.

Yet further embodiments may provide an apparatus. The apparatus may include a processor configured to at least perform or cause the apparatus to at least perform receiving a representation of a codeword that includes a plurality of bits. The codeword may be subject to a plurality of parity-check equations each of which includes participating bits corresponding to a respective plurality of the bits of the codeword. Each bit of the codeword may participate in one or more parity-check equations and each bit may be associated with at least one reliability value. The apparatus may further preform determining whether the participating bits for a particular parity-check equation from the plurality of parity check equations satisfy the particular parity-check equation, determining whether at least one of the participating bits should be inverted based on the result of the parity-check equation, determining, based on whether the at least one of the participating bits should be inverted, a magnitude of a reliability modification to one or more reliability values associated with at least one of the participating bits, and modifying the one or more reliability values by the magnitude of the reliability modification.

Embodiments may also provide a memory controller configured to cause decoding at least one codeword. The decoding may be performed by at least a method including receiving a representation of the codeword that includes a plurality of bits. The codeword may be subject to a plurality of parity-check equations each of which includes participating bits corresponding to a respective plurality of the bits of the codeword. Each bit of the codeword may participate in one or more parity-check equations and each bit associated with at least one reliability value. The decoding may be further performed by determining whether the participating bits for a particular parity-check equation from the plurality of parity check equations satisfy the particular parity-check equation, determining whether at least one of the participating bits should be inverted based on the result of the parity-check equation, determining, based on whether the at least one of the participating bits should be inverted, a magnitude of a reliability modification to one or more reliability values associated with at least one of the participating bits, and modifying the one or more reliability values by the magnitude of the reliability modification.

BRIEF DESCRIPTION OF THE DRAWINGS

Figure 1:
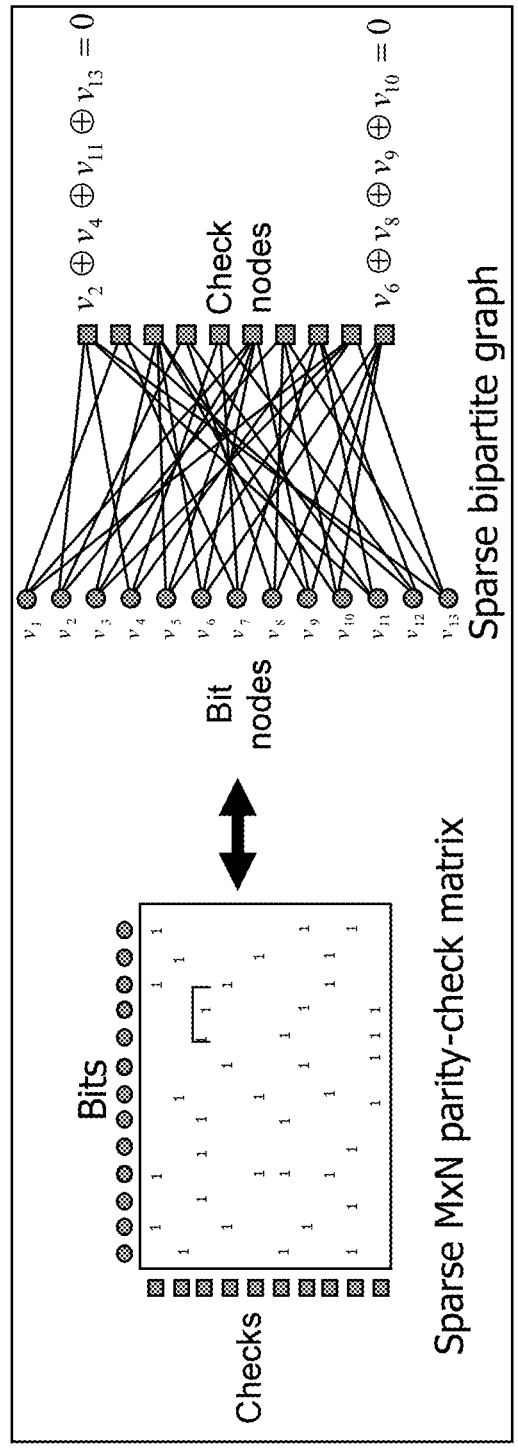
Figure 2:
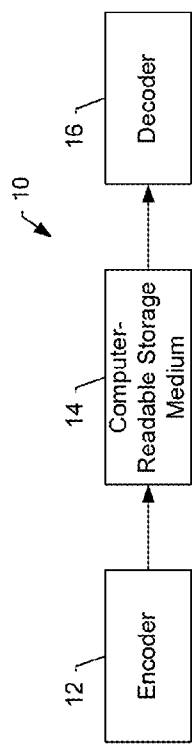
Figure 3:
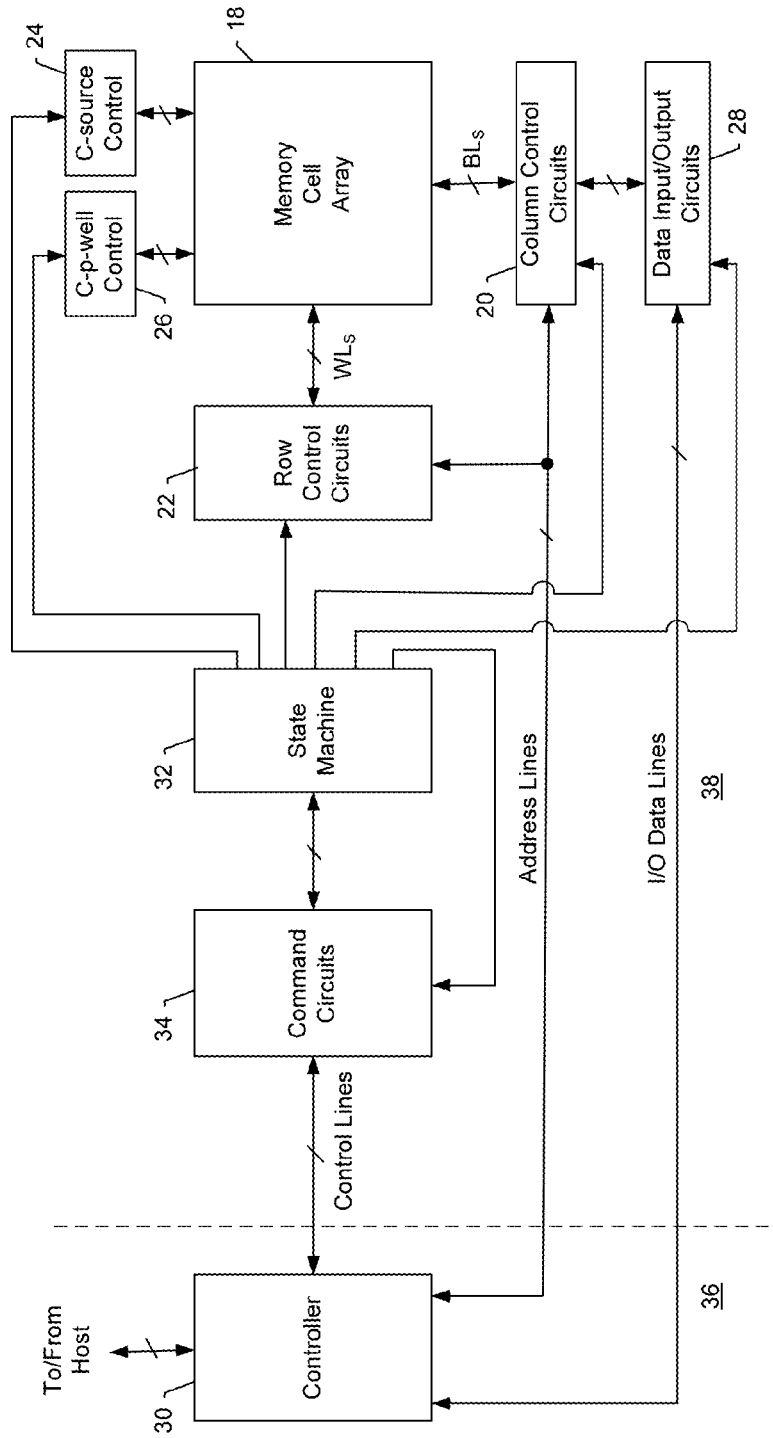
Figure 4:
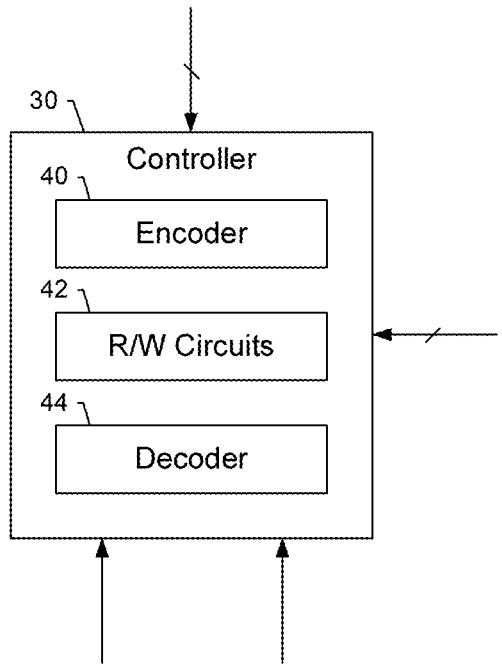
Figure 5:
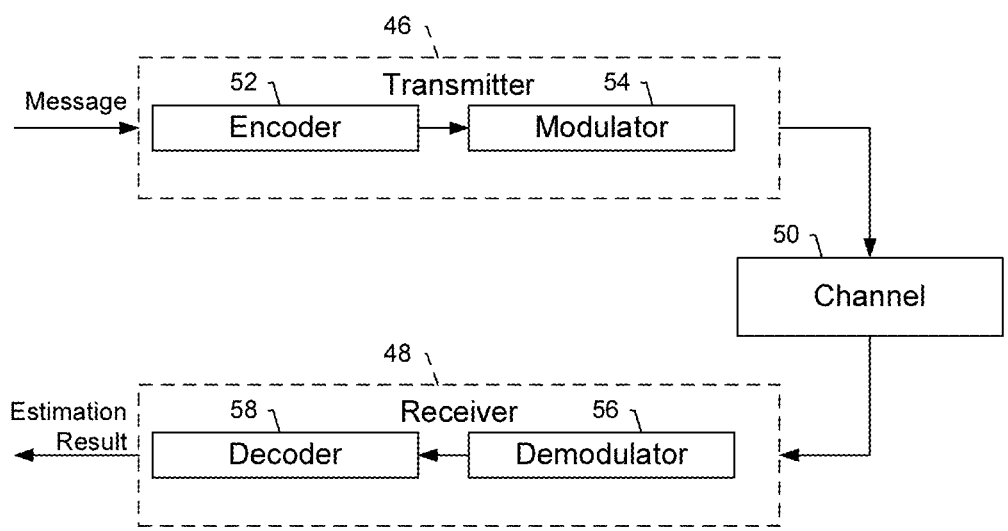
Figure 8:
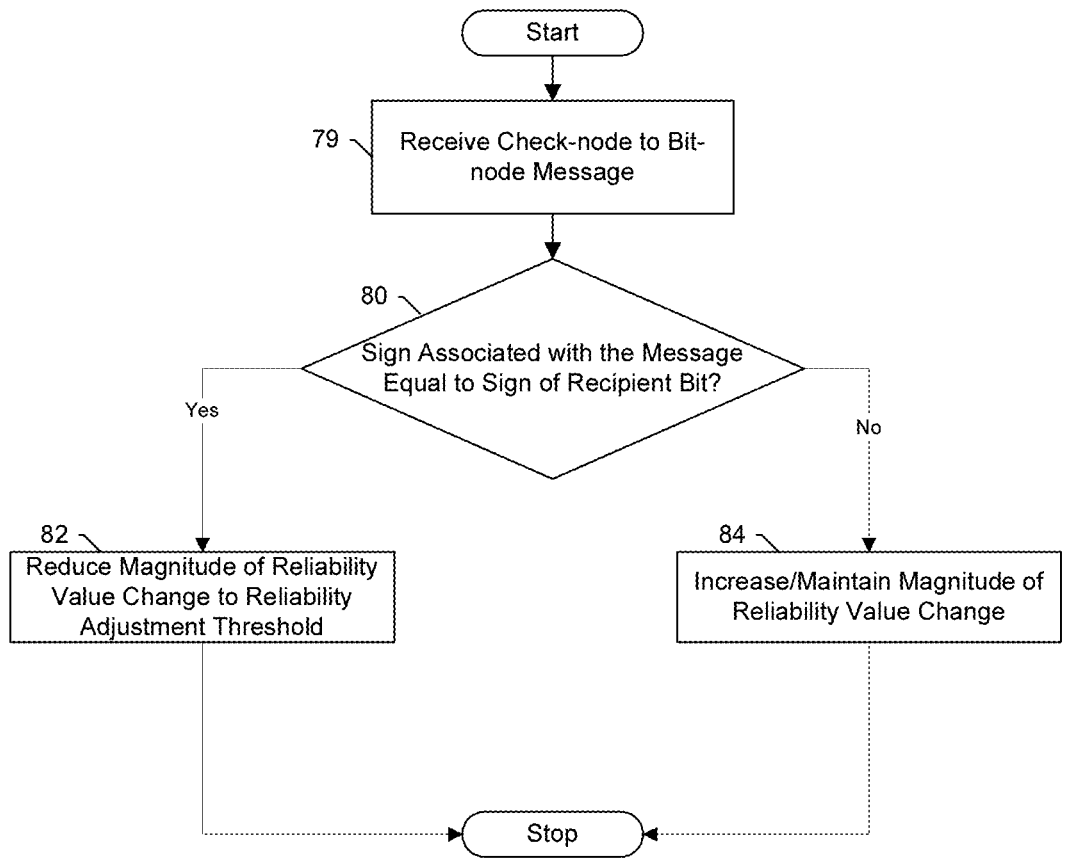
Figure 9:
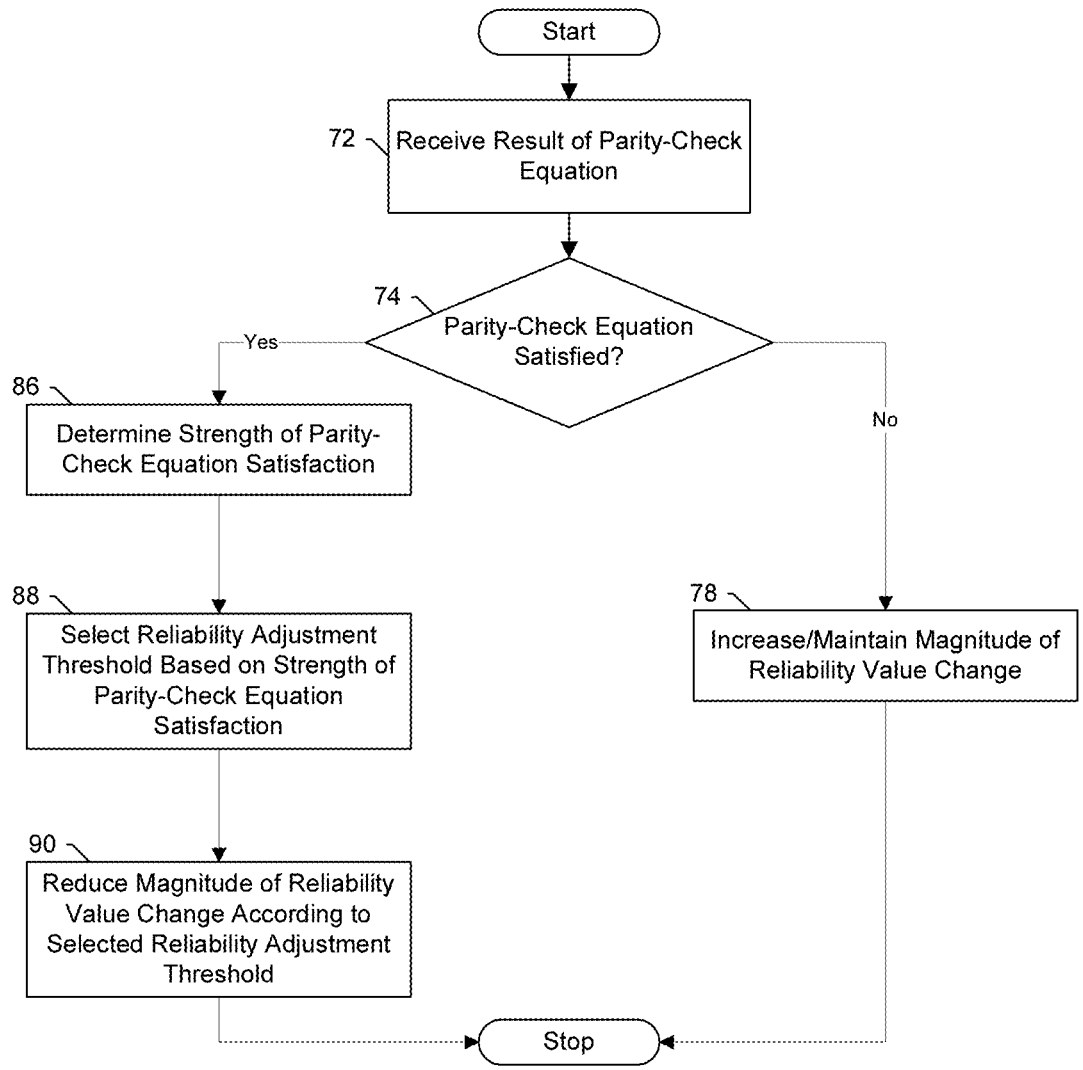
Figure 10:
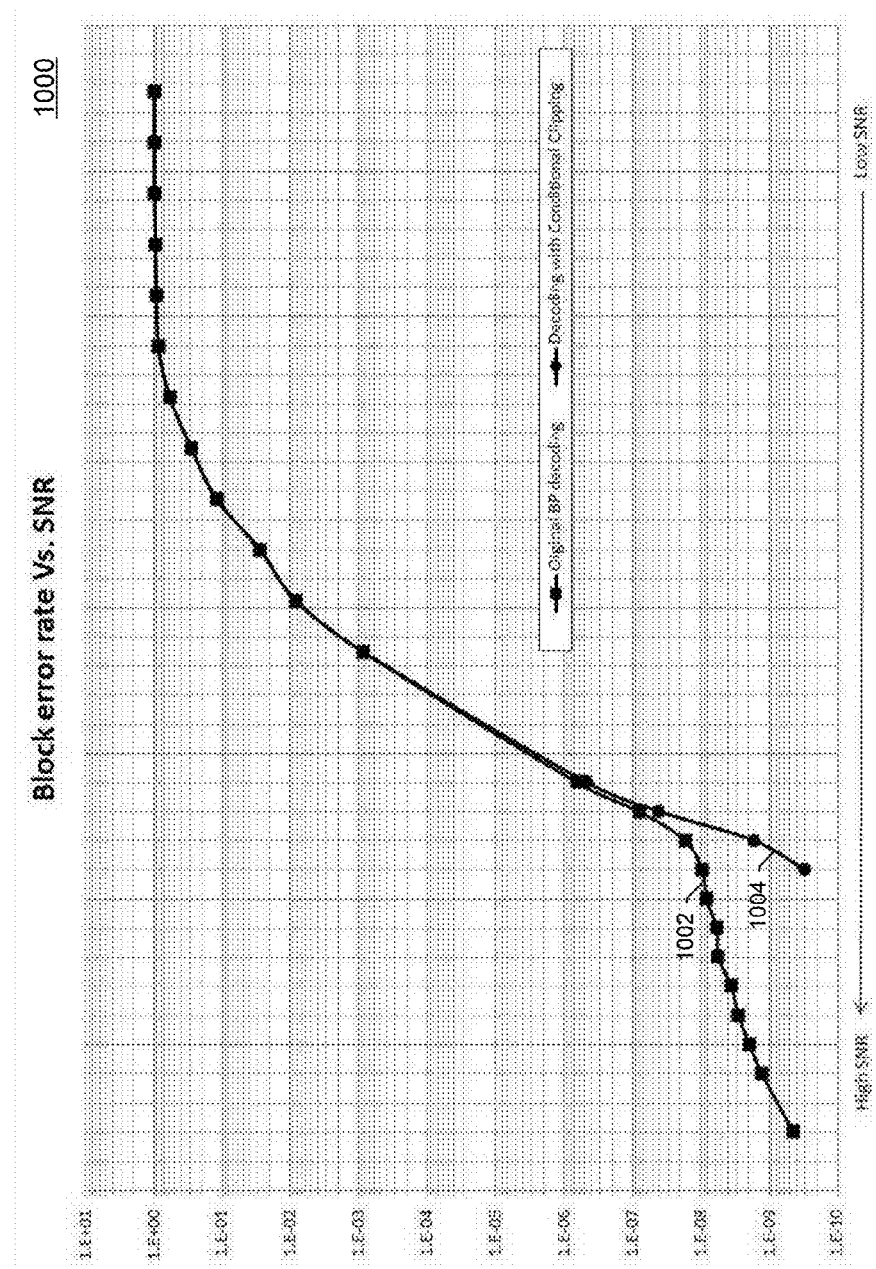

Having thus described the invention in general terms, reference will now be made to the accompanying drawings, which are not necessarily drawn to scale, and wherein:

FIG. 1 illustrates the equivalence between a parity check matrix and a bipartite graph;

FIG. 2 is a schematic block diagram of one type of system or apparatus that may benefit from example embodiments of the present invention;

FIG. 3 is a schematic block diagram of a more particular example of an apparatus embodied as a flash memory device, according to example embodiments of the present invention;

FIG. 4 is a schematic block diagram of part of the flash memory device of FIG. 3, more particularly illustrating the controller according to one example embodiment;

FIG. 5 is a schematic block diagram of another more particular example of an apparatus embodied as a communication system, according to other example embodiments of the present invention;

FIGS. 6-9 are flowcharts illustrating various operations in methods according to example embodiments of the present invention; and FIG. 10 is an illustration of a graph depicting the "error floor" effect according to some example embodiments of the present invention.

DETAILED DESCRIPTION

Example embodiments of the present invention will now be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like reference numerals refer to like elements throughout. Reference may be made herein to terms specific to a particular system, architecture or the like, but it should be understood that example embodiments of the present invention may be equally applicable to other similar systems, architectures or the like.

FIG. 2 illustrates one type of system or apparatus 10 that may benefit from example embodiments of the present invention. As shown, the apparatus may include an encoder 12, computer-readable storage medium 14 and a decoder 16. Generally, the encoder is configured to receive and encode user data as one or more codewords, and pass the codewords to the computer-readable storage medium. The decoder, in turn, is configured to receive a representation of the codeword from the computer-readable storage medium 14 and decode the codeword as a representation of the user data.

The encoder 12 and decoder 16 may be embodied as various means for implementing the various functionalities of example embodiments of the present invention. For example, the encoder 12 and decoder 16 may be embodied as or otherwise include one or more processors such as one or more of a microprocessor, a coprocessor, a controller, a special-purpose integrated circuit such as, for example, an ASIC (application specific integrated circuit), an FPGA (field programmable gate array), DSP (digital signal processor), or a hardware accelerator, processing circuitry or other similar hardware. Even further, the encoder and decoder may include a plurality of transistors, logic gates, a clock (e.g., oscillator), other circuitry, and the like to facilitate performance of the functionality described herein. In various examples, the encoder and decoder may be embodied as hardware alone or in combination with software. In this regard, either or both of the encoder and decoder may be configured to execute instructions stored in a computer-readable storage medium.

The computer-readable storage medium 14 may be embodied as various means for receiving data from the encoder 12, and providing data to the decoder 16. More particularly, for example, the computer-readable storage medium may be embodied as a computer-readable storage medium, or a computer-readable transmission medium such as signals propagating in a channel of a communication system. In the context of a computer-readable storage medium, the respective medium may be non-transitory and include volatile and/or non-volatile memory. Suitable examples of volatile memory include Random Access Memory (RAM) including dynamic and/or static RAM, on-chip or off-chip cache memory or the like. And non-volatile memory may include embedded and/or removable memory, and may include, for example, Read-Only Memory (ROM), flash memory, magnetic storage devices, optical disc drives or the like.

FIG. 3 illustrates a more particular example of an apparatus embodied as a flash memory device, according to example embodiments of the present invention. A memory cell array 18 that includes a plurality of memory cells arranged in a matrix is controlled by a column control circuit 20, a row control circuit 22, a c-source control circuit 24 and a c-p-well control circuit 26. The column control circuit is connected to bit lines (BL) of the memory cell array for reading data stored in the memory cells of the array, for determining a state of the memory cells of the array during a writing operation, and for controlling potential levels of the bit lines to promote the writing or to inhibit the writing. The row control circuit is connected to word lines (WL) to select one of the word lines, to apply read voltages, to apply writing voltages combined with the bit line potential levels controlled by column control circuit, and to apply an erase voltage coupled with a voltage of a p-type region on which the memory cells of the array are formed. The C-source control circuit controls a common source line connected to the memory cells of the array. And the c-p-well control circuit controls the c-p-well voltage.

The data stored in the memory cells of the array 18 are read out by the column control circuit 20 and are output to external I/O lines via I/O data lines and a data input/output buffer 28. Program data to be stored in the memory cells are input to the data input/output buffer via the external I/O lines, and are transferred to the column control circuit. The external I/O lines are connected to a controller 30.

Command data for controlling the flash memory device are input to a command interface connected to external control lines which are connected with the controller 30. The command data inform the flash memory of what operation is requested. The input command is transferred to a state machine 32 that controls the column control circuit 20, row control circuit 22, c-source control circuit 24, c-p-well control circuit 26 and data input/output buffer 28. The state machine can output a status data of the flash memory such as READY/BUSY or PASS/FAIL.

The controller 30 is connected or connectable with a host system such as a personal computer, laptop computer, tablet computer, smartphone, digital camera, personal digital assistant or the like. It is the host which initiates commands, such as to store or read data to or from the memory array 18, and provides or receives such data, respectively. The controller converts such commands into command signals that can be interpreted and executed by command circuits 34. The controller also typically contains buffer memory for the user data being written to or read from the memory array. A typical memory device includes an integrated circuit chip 36 that includes the controller, and one or more integrated circuit chips 38 that each contains a memory array and associated control, input/output and state machine circuits. However, the memory array and controller circuits of such a device may instead be integrated together on one or more integrated circuit chips. The memory device may be embedded as part of the host system, or may be included in a memory card that is removably insertable into a mating socket of host systems. Such a card may include the entire memory device, or the controller and memory array, with associated peripheral circuits, may be provided in separate cards.

FIG. 4 is an enlarged view of part of FIG. 3, more particularly illustrating the controller 30 according to one example embodiment. As shown, the controller includes an encoder 40 for encoding user data received from the host as one or more codewords, circuitry 42 for instructing the command circuits 34 to store the codewords (or only the non-punctured bits thereof, if any of the bits of the codewords are punctured bits) in the memory cell array 18 and for instructing the command circuits to retrieve the stored codewords (or the stored portions thereof in the punctured bit case) from the memory cell array. As shown, the controller also includes a decoder 44 for decoding a representation of the codewords as retrieved by the circuitry 42.

FIG. 5 illustrates another more particular example of an apparatus embodied as a communication system, according to other example embodiments of the present invention. As shown, the communication system includes a transmitter 46 and a receiver 48 that communicate across a channel 50. As shown, the transmitter includes an encoder 52 and a modulator 54. The receiver includes a demodulator 56 and decoder 58. The encoder receives a message and generates a corresponding codeword. The modulator subjects the generated codeword to a digital modulation such as BPSK, QPSK, multi-valued QAM or OFDM, and transmits the resulting modulated signal to the receiver via the channel. At the receiver, the demodulator receives the modulated signal from the channel and subjects the received modulated signal to a digital demodulation such as BPSK, QPSK or multi-valued QAM. And the decoder decodes the resulting representation of the original codeword.

Example embodiments of the present invention provide apparatuses and methods for decoding a representation of a codeword. Example embodiments may be described in the context of LDPC coding, but it should be understood that example embodiments may be equally applicable to other iterative decoders for binary codes that satisfy the basic requirements of the method.

Figure 6:
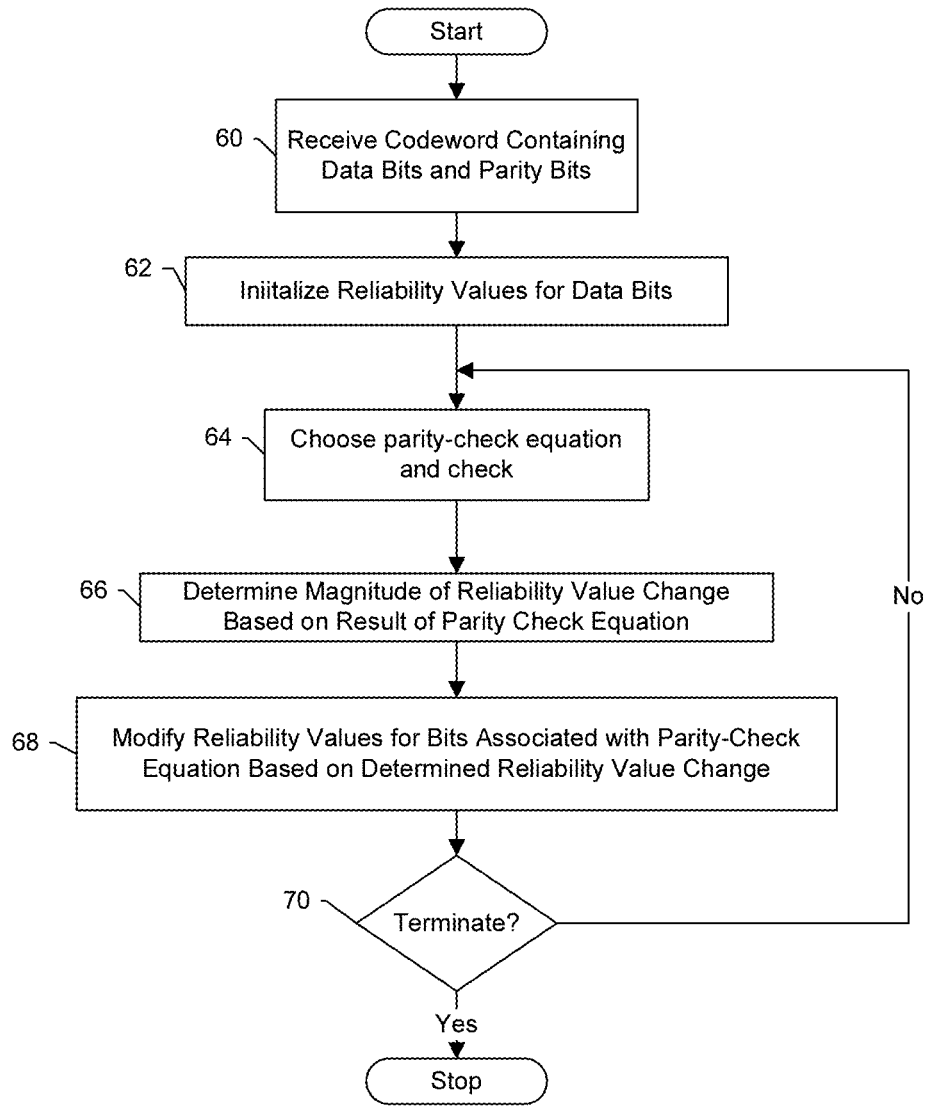
Figure 7:
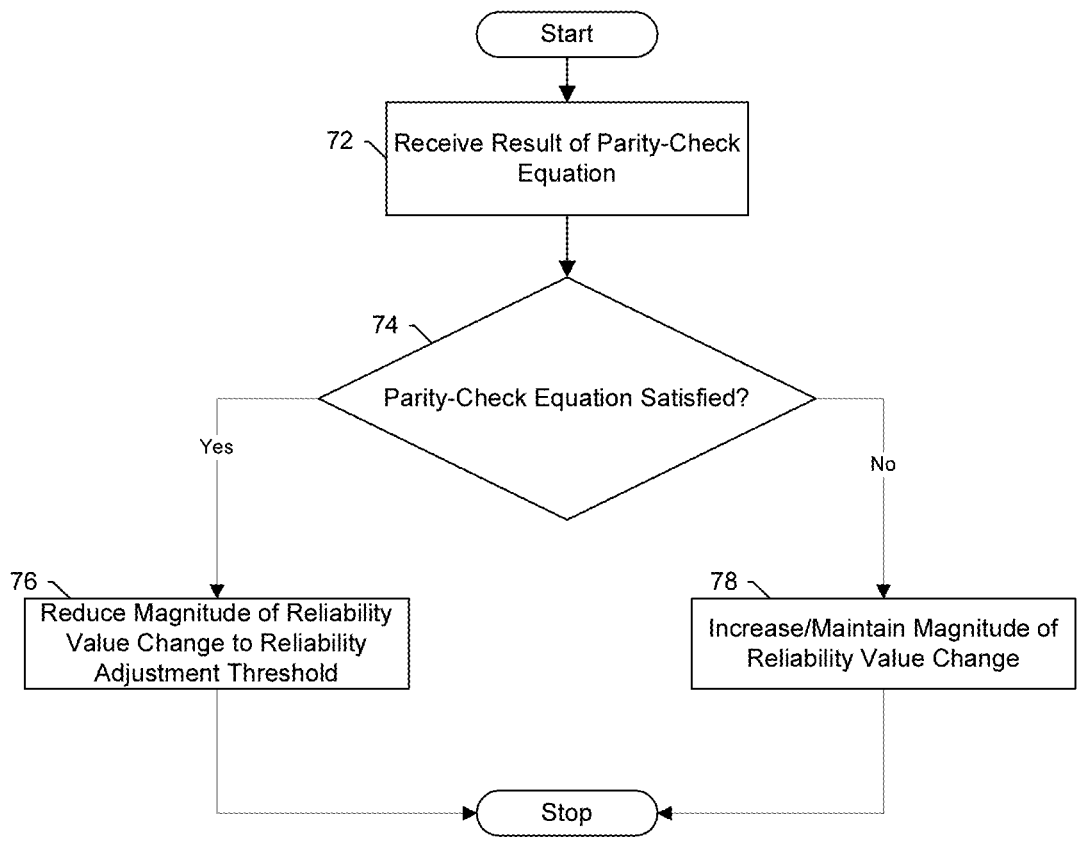

FIG. 6 illustrates a flowchart of various operations in a method of decoding a representation of a codeword, in accordance with example embodiments of the present invention. FIGS. 7-9 illustrate particular example embodiments of the present invention which relate to determining a magnitude of a reliability value change based on the result of a parity-check equation. Generally, these example embodiments may be compatible in terms of their data path (message passing schedule) with decoding algorithms such as the BP algorithm.

The method may include receiving a representation of a codeword that includes a plurality of bits (e.g., from computer-readable storage medium 14), and associating the bits with a respective plurality of data bits and reliability bits. In some embodiments, the data bits are represented as one-bit hard-bit values and the reliability bits are represented as multiple-bit soft-bit values. In this regard, the data bits values may be initially set according to the representation of the codeword and represent the bits of the codeword, and the reliability bits may represent measures of reliability of respective data bit values.

As shown in block 60, for example, a message of predefined bits in sign-magnitude representation may be attached to each bit of the codeword. This representation may include one sign-bit representing the hard value of the bit, and include an L-bit soft-bit value representing the reliability measure of the bit. In one example, the representation may be a four-bit sign-magnitude representation, including the one sign-bit and three-bit (L=3) soft-bit value that may be from 0 to 7 (binary 000 to 111). As shown in block 62, each bit may be initialized with a hard bit according to the received value of the bit and assigned a reliability measure, which may be predefined (e.g., 2 or 3) or a function of the initial received value. In some embodiments, initializing the value for each bit may include completing a first phase whereby parity-check equation messages are computed without taking into account whether the parity-check equation is satisfied or not (e.g., whereby the magnitude of a reliability change value is the same whether the message is satisfied or unsatisfied).

The method may include updating at least some of the hard-bit values or soft-bit values of the bits over a plurality of iterations. In this regard, updating the hard-bit values or soft-bit values may include for each of the iterations, computing an updated hard-bit value or soft-bit value of one or more bits of a respective subset of the bits as a function of current hard-bit values of the bits of the subset, and the current hard-bit value and soft-bit value of the respective bit. In one example, the codeword is subject to a plurality of parity-check equations each of which may include participating bits corresponding to the bits of a respective subset of bits, with each bit of the codeword participating in one or more parity-check equations. Thus, as shown in block 64 for each iteration, a different parity-check equation may be chosen and checked as to whether or not the parity-check equation is satisfied.

The parity-check equations may be any form of bit evaluation that provides a parity-check of the bits that are designated as participating in the particular parity-check equation. For example, the bits may be the subject of a mathematical operation, such as a bitwise sum to determine whether the result is an even number or an odd number. As an example, an even sum (e.g., a least significant bit of 0) may be indicative of a satisfied parity-check equation, and an odd sum (e.g., a least significant bit of 1) may be indicative of an unsatisfied parity-check equation. Equivalently, a parity-check equation may include an exclusive or (XOR) operation performed on the participating bit-values, with the result of the XOR operation determining whether the parity-check equation has been satisfied. Although the parity-check equation may be generally referred to with respect to these examples, additionally or alternatively various other forms of parity-checks could also be applicable.

In one example, each of the update values may reflect an increase in the current soft-bit value of the participating bits in an instance in which the parity-check equation is satisfied, or a decrease in the current soft-bit value of the participating bits in an instance in which the parity-check equation is not satisfied. Thus, in a first instance the parity-check equation is satisfied, and each update value may reflect an increase in the current soft-bit value; and in a second instance the parity-check equation is not satisfied, and each update value may reflect a decrease in the current soft-bit value.

In one example, the method may include determining for at least one participating bit, based on whether the particular parity-check equation is satisfied, at least one magnitude of a reliability modification to the reliability value associated with at least one of the participating bits, and modifying the reliability value of the at least one participating bit as a function of the magnitude of the reliability modification. Using the graph structure where participating bits are identified with bit nodes, and parity check equations are identified with check nodes and modification of the reliability values may be associated with sending a message from the check nodes to the bit nodes.

For example at a check node c, an $R_{cv}$ message may be computed for modifying the reliability value associated with bit-node v. The magnitude of the message $R_{cv}$ is computed based on whether the equation represented by check node c is satisfied or not. For example, if the equation is satisfied then the magnitude of $R_{cv}$ is determined to be at a certain value, but if the equation is not satisfied then the magnitude of $R_{cv}$ is determined to be at a higher value.

$R_{cv}$ may be computed in 2 phases. In the first phase $R_{cv}$ may be computed as described above with respect to Eq (5), $$\left(\text{i.e. } R_{cv} = \varphi^{-1}\left(\sum_{v' \in N(c,G)\setminus v} \varphi(Q_{v'c})\right)\right).$$

In the second phase the equation at node c may be tested. If the equation is satisfied $R_{cv}$ may be multiplied by a positive number smaller than 1, in order to decrease its magnitude. Equivalently, the second phase may be computed by comparing the sign of $R_{cv}$ with the sign of the bit-node v. If their signs are equal, $R_{cv}$ may be multiplied by a positive number smaller than 1, in order to decrease its magnitude.

Example embodiments provide for modification of the magnitude of the reliability value change associated with the update messages. This magnitude may be altered because different results from the parity-check equation may provide more or less certainty about the reliability of each hard-bit value. For example, when the parity-check equation is unsatisfied, it can be presumed with 100% confidence that the equation is not satisfied, and thus at least one bit is in error. On the contrary, when the parity-check equation is satisfied, the possibility still exists that two or more bits are in error in such a pattern that results in the errors canceling one another out during the parity check (e.g., two errors for a parity-check equation that requires an even result would cancel one another out, thus satisfying the equation erroneously). As such, a result of such a satisfied parity-check equation is not completely indicative that no error has occurred.

Additionally or alternatively, messages originating from satisfied parity-check equations increase the reliability associated with bit nodes that are the recipient of said messages. Therefore, correct bits may become more confident in their correctness (e.g., an increase in their associated reliability value), but also incorrect bits may also become more confident that their value is correct. Messages originating from unsatisfied parity-check equations may decrease the reliability of their recipient bit nodes. These unsatisfied parity-check messages may function to change the value of the hard-bit in circumstances where the reliability value associated with the hard-bit decreases to the point where it can reasonably be assumed that the bit is erroneous. In other words, unsatisfied equations may function to correct erroneous bits, but satisfied equations may only reinforce that the bits of the equation are correct. Thus, messages from unsatisfied equations may be viewed as more useful during a decoding operation, because such messages have the ability to not only detect errors, but also correct said errors.

The terms "modifying" "modify" "modification", "adjust", and "adjustment" as generally used in the context of providing a magnitude value for a message result from a parity-check equation should be understood to refer to any various permutation or combination of selecting, altering, adjusting, generating, deciding, or otherwise providing a magnitude value for a message result from a parity-check equation. As such, these terms should not be read to only include altering a value already present in such a parity-check equation message, but should also be read on any method of populating a reliability value change component of such a parity-check equation message.

As such, since messages from satisfied equations and unsatisfied equations provide different information about their associated bit nodes, it may be appropriate to alter the magnitude of the reliability value change associated with the message sent as a result of the parity-check equation based on the result of said parity-check equation. This modification and transmission of the message may occur at block 68. Accordingly, an iterative decoder using message passing (e.g., an LDPC decoding using Belief Propagation) along edges of a tanner graph may compute the messages originating from parity-check nodes as a function of the equation associated with the check node being satisfied or not. The resulting message from such a parity-check node may have a different numerical value (e.g., for the magnitude of the reliability value change), where the absolute value of the numerical value depends upon whether the parity-check equation associated with the node corresponding to the message is satisfied or unsatisfied. For example, in some embodiments, the magnitude of the reliability value change component of the parity-check equation message may be implemented such that the absolute value of the magnitude of the reliability value change is lower for a message resulting from a satisfied parity-check equation than for an unsatisfied parity-check equation. FIGS. 7-9 provide various implementations of this adjustment of said magnitude.

After modifying the magnitude of the reliability value as described with respect to block 68, the method of FIG. 6 may proceed to block 70, where a decision as to whether to terminate the method occurs. As described above, the method may proceed through multiple iterations to test different bit nodes and utilize different parity-check equations. The method may thus terminate after the decoding process has completed, or it may end before testing each bit node, depending upon the implementation of the decoding algorithm.

FIG. 7 illustrates a flowchart of various operations for a method for determining a magnitude of a reliability value change in accordance with example embodiments of the present invention. As described above with respect to FIG. 6, the magnitude of the reliability change values resulting for messages originating from parity-check equations may be modified based on the results of said parity-check equations. The method of FIG. 7 describes embodiments wherein messages that result from satisfied parity-check equations are reduced to a reliability change threshold value, also known as a "clip" value.

At block 72, a result from a parity-check equation is received. As described above with respect to FIG. 6, the result may be generated by comparing using a set of hard-bits of a codeword. These hard-bits may be analyzed using a parity-check equation, such as by determining whether the sum of the hard-bits results in an even value. As described above with respect to FIG. 6, the method may include a "first pass" iteration whereby update messages and their corresponding reliability change value magnitudes are computed without taking into account whether the associated parity-check equation is satisfied. Thus, the methods described with respect to FIGS. 7-9 may occur after this initial iteration has completed. However, although embodiments are described as performing such a first iteration, alternative embodiments may also be provided wherein the reliability values are initialized by other means or processes, such that the results of parity-check equations are modified in all iterations as described herein.

At block 74, the method determines whether the parity-check equation was satisfied based on the result received at block 72. If the parity-check equation was satisfied, the method proceeds to block 76, otherwise the method proceeds to block 78.

At block 76, the magnitude of a reliability change value associated with an output message is reduced to a reliability change threshold value. This reliability change threshold value would typically be assigned a value less than a magnitude for a reliability change value resulting from an unsatisfied equation, in order to give an advantage to messages originating from unsatisfied equations. In some embodiments, the reliability change threshold value may be determined as a function of an iteration count. For example, as the decoding process proceeds, the reliability change threshold value may be increased or decreased for successive iterations.

For example, in mathematical terms, the message output for satisfied equations for the method of FIG. 7 may be expressed as:

$$\text{message}=\text{sign}(\text{message})\cdot\min(\text{abs}(\text{message}),\text{clipvalue}) \quad (7)$$

Where the content of the message is a sign value (e.g., positive or negative) and a minimum of either the clipvalue (e.g., the reliability change threshold value) or the absolute value of the message contents.

Additionally or alternatively, the magnitude of the reliability change value may be multiplied by a positive number less than 1 for satisfied parity-check equations. In such cases, numbers multiplying particular messages may be different for one another, depending upon factors such as the estimated reliability of the bits, the iteration count of the decoding operation or various other factors. In some embodiments, not all messages associated with satisfied equations may be multiplied in this manner.

If the result of the parity-check equation is an unsatisfied equation, then the method proceeds to block 78, where the magnitude of the reliability change value may be increased or maintained as the original level. The method ends after determining the reliability change value, where the reliability values for one or more bits associated with the parity-check equation are modified.

FIG. 8 illustrates a flowchart of various operations for an additional or alternative method for determining a magnitude of a reliability change value in accordance with example embodiments of the present invention. As described above with respect to FIGS. 6-7, the magnitude of the reliability change values resulting for messages originating from parity-check equations may be modified based on the results of said parity-check equations. The method of FIG. 8 describes embodiments wherein a sign value associated with a message generated from a parity-check equation is compared with the sign of a recipient bit, and the magnitude of the reliability change value is modified based on whether the sign of the message matches the sign of the recipient bit. In this manner, embodiments provide for reducing the magnitude of reliability change values associated with bits that have the same sign as the message sent to the bits. Processing in this manner may provide an advantage for messages that invert the recipient bit because, as described above, such messages may be more useful in arriving at a correctly decoded codeword.

The method described with respect to FIG. 8 may begin with a "first pass" iteration as described with respect to FIG. 7, and the method may proceed through block 79, where a check-node to bit-node message is received (e.g., as a result of a parity-check equation performed at the check-node) as described above. At block 80, the method may determine whether the sign of a message generated at the check-node to bit-node message is the same as the sign of the recipient bit. If the sign of the message and the sign of the recipient bit (e.g., positive where the recipient bit is 1, negative where the recipient bit is 0) do not match, the method proceeds to block 84. Otherwise, if the signs match, the method proceeds to block 82.

At block 82, the magnitude of the reliability value change may be reduced, as described above with respect to FIG. 7 and block 76. The method for determining the magnitude of the reliability value change may be performed in a similar manner as described above with respect to block 76, whereby a reliability change threshold or multiplication by a number less than one are employed.

At block 84, the method may modify the magnitude of the reliability change value as described above with respect to block 78. Correspondingly, the magnitude may be maintained or increased in circumstances where the sign of the message and the sign of the recipient bit do not match.

FIG. 9 illustrates a flowchart of various embodiments for yet another additional or alternative method for determining a magnitude of a reliability change value in accordance with example embodiments of the present invention. As described above with respect to FIGS. 6-8, the magnitude of the reliability change values resulting from messages originating from parity-check equations may be modified based on the results of said parity-check equations. FIG. 9 depicts a method whereby the reliability change values may be associated not only with whether a particular parity-check equation is satisfied, but also based on how strongly said parity-equation is satisfied. It may be possible to derive how likely a satisfied parity-check equation is to be correctly satisfied by examining various factors of the bits involved in the parity-check equation. For example, certain bits may be determined to be more likely to contain errors based on the significance of said bits, or a parity-check equation may be identified as more likely to be correct based on the iteration count of the decoding operation (e.g., as the iteration counts increase, it may be determined to be more likely that such equations are "correctly" or "strongly" satisfied). Thus, if it can be determined that the parity-check equation is "strongly" satisfied, the magnitude of the reliability value change may be increased relative to a magnitude for a parity-check equation that is "weakly" or "not strongly" satisfied.

The method described with respect to FIG. 9 may begin with a "first pass" iteration as described with respect to FIGS. 7 and 8, and the method may proceed through block 72 as described above. At block 74, the method determines whether the parity-check equation was satisfied based on the result received at block 72. If the parity-check equation was satisfied, the method proceeds to block 86, otherwise the method proceeds to block 78.

At block 86, the method determines how strongly the parity-check equation was satisfied. The message containing the result of the parity-check equation may include an additional value indicating the strength of the satisfaction of the parity-check equation. For example, the message may include a value $R_c$, derived similarly to the value $R_{cv}$ described with respect to equation (5), above. However, the value of $R_c$ may be derived as a sum over all of the bit nodes of the parity-check equation, thus resulting in the following equation:

$$R_c = \phi^{-1}(\Sigma_{v' \in N(c,G)} \phi(Q_{v'c})) \quad (8)$$

The value $R_c$ may indicate how strong the parity-check equation was satisfied. As such, at block 88, this value may be compared to a set of satisfaction thresholds for determining how to modify the magnitude of the reliability change message. Each threshold may be associated with a different reliability change threshold, such that messages that have a value indicating a stronger satisfaction of the parity-check equation have a higher magnitude than messages indicating a less strongly satisfied parity-check equation. As described above with respect to FIG. 7, these values may be dynamically adjusted throughout the decoding process. For example, the different thresholds (e.g., satisfaction threshold, reliability change threshold, etc.) may be adjusted based on an iteration count of the decoding process. If the parity-check equation is not satisfied, the method may instead proceed to block 78, which may function in a similar manner to the like-numbered block of FIG. 7.

In any of the aforementioned example embodiments, a plurality of iterations may be performed for the parity-check equations, with some iterations operating on the same parity-check equation. In this regard, the iterations may continue until all of the parity-check equations are satisfied (not necessarily when all of the soft-bit values are at their maximum), or until a predefined number of iterations has been performed without achieving satisfaction of all of the parity-check equations, at which point failure may be declared.

It should be appreciated that a number of variations of the aforementioned example embodiments may be implemented so as to achieve one or more of the benefits of those embodiments.

In any of the aforementioned example embodiments of FIGS. 6-9, a plurality of iterations may be performed for the parity-check equations. In this regard, the iterations may continue for a predetermined number of iterations, or for a number of iterations that may be computed as a function of the average number of errors, or as a function of the number of non-satisfied parity-check equations (the syndrome weight).

The method of example embodiments of the present invention may generally be used in lieu of other full-power decoding algorithms such as belief propagation. In various instances, however, it may be beneficial to selectively implement the method of example embodiments and a decoding algorithm, such as depending on the quality of the computer-readable storage medium 14.

FIG. 10 depicts a graph illustration of the "error floor" effect described above, where, below a certain "noise" level in the communication channel or in the memory device, the error rate of the output of the decoder begins to decrease much more slowly even though the "noise" that is responsible for the bit errors becomes smaller. The graph 1000 depicts two curves, a first curve 1002 and a second curve 1004. These curves depict the error rate of two different decoding algorithms as the signal-to-noise ratio of the channel changes. The first curve 1002 corresponds to an error rate for a standard prior art decoding algorithms. The second curve 1004 corresponds to an error rate for a decoding algorithm employing example embodiments of the invention as described herein. As can be readily discerned from the graph, the first curve 1002 experiences a "knee" at an error rate of around one error for every $10^8$ bits. This knee is indicative that, even if the signal-to-noise ratio continues to increase, the corresponding reduction in error rate is less and less. In other words, it takes a larger and larger signal-to-noise ratio increase to obtain any decrease in the error rate.

In contrast, the second curve 1004 corresponds to a decoding algorithm implementing embodiments of the invention as described herein. As can be readily discerned from the graph, the second curve 1004 experiences a significantly less pronounced "knee", whereby the decoding algorithm continues to provide robust decreases in the error rate as the signal-to-noise ratio increases.

According to one aspect of the example embodiments of present invention, functions, such as those illustrated by the flowcharts of FIGS. 6-9, performed by the system or apparatus 10 (FIG. 2), such as a flash memory device (FIG. 3, 4) or communication system (FIG. 5), may be performed by various means. It will be understood that each block or operation of the flowcharts, and/or combinations of blocks or operations in the flowcharts, can be implemented by various means. Means for implementing the blocks or operations of the flowcharts, combinations of the blocks or operations in the flowcharts, or other functionality of example embodiments of the present invention described herein may include hardware, alone or under direction of one or more computer program code instructions, program instructions or executable computer-readable program code instructions from a computer-readable storage medium. In this regard, program code instructions may be stored in memory, and executed by a processor.

As will be appreciated, any suitable program code instructions may be loaded onto a computer or other programmable apparatus (e.g., processor, memory, or the like) from a computer-readable storage medium to produce a particular machine, such that the particular machine becomes a means for implementing the functions specified in the flowcharts' block(s) or operation(s). These program code instructions may also be stored in a computer-readable storage medium that can direct a computer, a processor or other programmable apparatus to function in a particular manner to thereby generate a particular machine or particular article of manufacture. The instructions stored in the computer-readable storage medium may produce an article of manufacture, where the article of manufacture becomes a means for implementing the functions specified in the flowcharts' block(s) or operation(s). The program code instructions may be retrieved from a computer-readable storage medium and loaded into a computer, processor, or other programmable apparatus to configure the computer, processor, or other programmable apparatus to execute operations to be performed on or by the computer, processor, or other programmable apparatus. Retrieval, loading, and execution of the program code instructions may be performed sequentially such that one instruction is retrieved, loaded, and executed at a time. In some example embodiments, retrieval, loading and/or execution may be performed in parallel such that multiple instructions are retrieved, loaded, and/or executed together. Execution of the program code instructions may produce a computer-implemented process such that the instructions executed by the computer, processor, or other programmable apparatus provide operations for implementing the functions specified in the flowcharts' block(s) or operation(s).

Accordingly, execution of instructions associated with the blocks or operations of the flowcharts by a processor, or storage of instructions associated with the blocks or operations of the flowcharts in a computer-readable storage medium, supports combinations of operations for performing the specified functions. It will also be understood that one or more blocks or operations of the flowcharts, and combinations of blocks or operations in the flowcharts, may be implemented by special purpose hardware-based computer systems and/or processors which perform the specified functions, or combinations of special purpose hardware and program code instructions.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions other than those explicitly described above are also contemplated as may be set forth in some of the appended claims. Although specific terms are employed herein, they are used in a generic and descriptive sense only and not for purposes of limitation.

What is claimed is:

1. A method comprising:
receiving a representation of a codeword that includes a plurality of bits, each of the plurality of bits associated with at least one bit-value and at least one reliability value, wherein the codeword is subject to a plurality of parity-check equations each of which includes participating bit-values corresponding to a respective plurality of the bits of the codeword, each bit of the codeword participating in one or more parity-check equations;

determining whether the bit-values of the participating bits for a particular parity-check equation from the plurality of parity check equations satisfy the particular parity-check equation;

determining for at least one participating bit, based on whether the particular parity-check equation is satisfied, at least one magnitude of a reliability modification to the reliability value associated with at least one of the participating bits, wherein the magnitude of the reliability modification for at least one bit is different where the particular parity-check equation is not satisfied from where the particular parity-check equation is satisfied;

determining that the magnitude of the reliability modification exceeds a reliability adjustment threshold, wherein the reliability adjustment threshold is determined based on whether the particular parity-check equation is satisfied;

in response to determining that the magnitude of the reliability modification exceeds the reliability adjustment threshold, reducing the magnitude to the reliability adjustment threshold; and modifying the reliability value of the at least one participating bit as a function of the magnitude of the reliability modification.

2. The method of claim 1, further comprising:
modifying one or more of the bit-values based on the modified reliability values; and
decoding the codeword using the one or more bit-values and the one or more reliability values.

3. The method of claim 1, wherein the magnitude of the reliability modification for at least one bit is greater where the particular parity-check equation is not satisfied than where the particular parity-check equation is satisfied.

4. The method of claim 1, further comprising:
modifying the at least one reliability value over a plurality of iterations, each iteration comprising determining whether a given set of participating bits satisfies a given parity-check equation associated with the given set of participating bits; and
determining the reliability adjustment threshold based on an iteration count of the plurality of iterations.

5. The method of claim 1, wherein the step of determining at least one magnitude of a reliability modification further comprises:
computing an initial magnitude of the reliability adjustment; and
in response to determining that the particular parity-check equation is satisfied, multiplying the initial magnitude by a positive number less than 1 to determine the magnitude of the reliability adjustment.

6. The method of claim 1, further comprising:
determining a reliability value for at least one of the plurality of bits using only extrinsic information.

7. The method of claim 1, further comprising:
in response to determining that the particular parity-check equation is satisfied, using the reliability values associated with the particular set of the plurality of bits to determine a probability that the particular parity-check equation is correctly satisfied, wherein the magnitude of the reliability modification is modified based on the probability that the particular parity-check equation is correctly satisfied.

8. The method of claim 7, further comprising:
comparing the probability that the particular parity-check equation is correctly satisfied with a correctness threshold; and modifying the magnitude of the reliability modification based on whether the probability exceeds the correctness threshold.

9. The method of claim 8, further comprising increasing the magnitude of the reliability modification in response to the probability exceeding the correctness threshold.

10. The method of claim 8, further comprising:
modifying the at least one reliability value over a plurality of iterations, each iteration comprising determining whether a given set of bits of the plurality of bits satisfies a given parity-check equation; and
determining the correctness threshold based on an iteration count of the plurality of iterations.

11. The method of claim 1, wherein the step of determining whether the bit-values of the participating bits for a particular parity-check equation satisfy the particular parity-check equation comprises determining whether the parity-check equation is satisfied based on an XOR operation performed on the participating bit-values.

12. A method comprising:
receiving a representation of a codeword that includes a plurality of bits, wherein the codeword is subject to a plurality of parity-check equations each of which includes participating bits corresponding to a respective plurality of the bits of the codeword, each bit of the codeword participating in one or more parity-check equations and each bit associated with at least one reliability value;

determining whether the participating bits for a particular parity-check equation from the plurality of parity check equations satisfy the particular parity-check equation;

determining whether at least one of the participating bits should be inverted based on the result of the parity-check equation;

determining, based on whether the at least one of the participating bits should be inverted, a magnitude of a reliability modification to one or more reliability values associated with at least one of the participating bits, wherein the magnitude of the reliability modification for at least one bit is different where the particular parity-check equation is not satisfied from where the particular parity-check equation is satisfied;

determining that the magnitude of the reliability modification exceeds a reliability adjustment threshold, wherein the reliability adjustment threshold is determined based on whether the particular parity-check equation is satisfied;

in response to determining that the magnitude of the reliability modification exceeds the reliability adjustment threshold, reducing the magnitude to the reliability adjustment threshold; and modifying the one or more reliability values by the magnitude of the reliability modification.

13. An apparatus comprising a processor configured to:
receive a representation of a codeword that includes a plurality of bits, each of the plurality of bits associated with at least one bit-value and at least one reliability value, wherein the codeword is subject to a plurality of parity-check equations each of which includes participating bit-values corresponding to a respective plurality of the bits of the codeword, each bit of the codeword participating in one or more parity-check equations;

determine whether the bit-values of the participating bits for a particular parity-check equation from the plurality of parity check equations satisfy the particular parity-check equation;

determine for at least one participating bit, based on whether the particular parity-check equation is satisfied, at least one magnitude of a reliability modification to the reliability value associated with at least one of the participating bits, wherein the magnitude of the reliability modification for at least one bit is different where the particular parity-check equation is not satisfied from where the particular parity-check equation is satisfied;

determine that the magnitude of the reliability modification exceeds a reliability adjustment threshold, wherein the reliability adjustment threshold is determined based on whether the particular parity-check equation is satisfied;

in response to determining that the magnitude of the reliability modification exceeds the reliability adjustment threshold, reduce the magnitude to the reliability adjustment threshold; and modify the reliability value of the at least one participating bit as a function of the magnitude of the reliability modification.

14. The apparatus of claim 13, further comprising:
modifying one or more of the bit-values based on the modified reliability values; and
decoding the codeword using the one or more bit-values and the one or more reliability values.

15. The apparatus of claim 13, wherein the magnitude of the reliability modification for at least one bit is greater where the particular parity-check equation is not satisfied than where the particular parity-check equation is satisfied.

16. The apparatus of claim 13, further comprising:
modifying the at least one reliability value over a plurality of iterations, each iteration comprising determining whether a given set of participating bits satisfies a given parity-check equation associated with the given set of participating bits; and
determining the reliability adjustment threshold based on an iteration count of the plurality of iterations.

17. The apparatus of claim 13, wherein the step of determining at least one magnitude of a reliability modification further comprises:
computing an initial magnitude of the reliability adjustment; and
in response to determining that the particular parity-check equation is satisfied, multiplying the initial magnitude by a positive number less than 1 to determine the magnitude of the reliability adjustment.

18. The apparatus of claim 13, further comprising:
determining a reliability value for at least one of the plurality of bits using on extrinsic information.

19. The apparatus of claim 13, further comprising:
in response to determining that the particular parity-check equation is satisfied, using the reliability values associated with the particular set of the plurality of bits to determine a probability that the particular parity-check equation is correctly satisfied, wherein the magnitude of the reliability modification is modified based on the probability that the particular parity-check equation is correctly satisfied.

20. The apparatus of claim 19, further comprising:
comparing the probability that the particular parity-check equation is correctly satisfied with a correctness threshold; and
modifying the magnitude of the reliability modification based on whether the probability exceeds the correctness threshold.

21. The apparatus of claim 20, further comprising increasing the magnitude of the reliability modification in response to the probability exceeding the correctness threshold.

22. The apparatus of claim 20, further comprising:
modifying the at least one reliability value over a plurality of iterations, each iteration comprising determining whether a given set of bits of the plurality of bits satisfies a given parity-check equation; and
determining the correctness threshold based on an iteration count of the plurality of iterations.

23. The apparatus of claim 13, wherein the step of determining whether the bit-values of the participating bits for a particular parity-check equation satisfy the particular parity-check equation comprises determining whether the parity-check equation is satisfied based on an XOR operation performed on the participating bit-values.

24. A memory controller configured to cause decoding at least one codeword, the memory controller configured to:
receive a representation of the codeword that includes a plurality of bits, each of the plurality of bits associated with at least one bit-value and at least one reliability value, wherein the codeword is subject to a plurality of parity-check equations each of which includes participating bit-values corresponding to a respective plurality of the bits of the codeword, each bit of the codeword participating in one or more parity-check equations;
determine whether the bit-values of the participating bits for a particular parity-check equation from the plurality of parity check equations satisfy the particular parity-check equation;
determine for at least one participating bit, based on whether the particular parity-check equation is satisfied, at least one magnitude of a reliability modification to the reliability value associated with at least one of the participating bits, wherein the magnitude of the reliability modification for at least one bit is different where the particular parity-check equation is not satisfied from where the particular parity-check equation is satisfied;
determine that the magnitude of the reliability modification exceeds a reliability adjustment threshold, wherein the reliability adjustment threshold is determined based on whether the particular parity-check equation is satisfied;
in response to determining that the magnitude of the reliability modification exceeds the reliability adjustment threshold, reduce the magnitude to the reliability adjustment threshold; and
modify the reliability value of the at least one participating bit as a function of the magnitude of the reliability modification.

* * * * *